(12) United States Patent
Baillet et al.

(10) Patent No.: US 8,440,092 B2
(45) Date of Patent: May 14, 2013

(54) METHOD FOR SELECTIVE ETCHING

(75) Inventors: Francis Baillet, Paladru (FR); Nicolas Gondrexon, Meylan (FR)

(73) Assignees: Institut Polytechnique de Grenoble, Grenoble Cedex (FR); Universite Joseph Fourier, Saint Martin d'Heres (FR)

( * ) Notice: Subject to any disclaimer, the term of this patent is extended or adjusted under 35 U.S.C. 154(b) by 277 days.

(21) Appl. No.: 12/743,451

(22) PCT Filed: Nov. 17, 2008

(86) PCT No.: PCT/FR2008/052069
§ 371 (c)(1),
(2), (4) Date: Oct. 4, 2010

(87) PCT Pub. No.: WO2009/071788
PCT Pub. Date: Jun. 11, 2009

(65) Prior Publication Data
US 2011/0017707 A1     Jan. 27, 2011

(30) Foreign Application Priority Data
Nov. 20, 2007   (FR) ..................................... 07 59179

(51) Int. Cl.
*B44C 1/22*     (2006.01)
*C03C 15/00*     (2006.01)
*C03C 25/68*     (2006.01)
*C23F 1/00*     (2006.01)

(52) U.S. Cl.
USPC ............................................................ 216/83

(58) Field of Classification Search .................... 216/83
See application file for complete search history.

(56) References Cited

U.S. PATENT DOCUMENTS

| 4,554,046 A | 11/1985 | Taguchi et al. |
| 6,746,967 B2 | 6/2004 | Brask et al. |
| 2004/0053503 A1 | 3/2004 | Brask |

FOREIGN PATENT DOCUMENTS
EP    0 844 650 A2    5/1998

OTHER PUBLICATIONS

M. Lucey, "300 mm Megasonic Cleaning Process to Address Material Consumption Requirements for sub-65nm", Microelectronics and Electron Devices, 2005. WMED '05. 2005 IEEE Workshop, Boise, ID, USA, Apr. 15, 2005, Piscataway, NJ, USA, IEEE, p. 21-23 XP010798764.

Database Inspec; The Institution of Electrical Engineers, Stevenage, GB; Inspec No. 9001583 Woo Song Che et al., "The improvement of wet anisotropic etching with megasonic wave" XP002483540, abstract, 2004.

*Primary Examiner* — Roberts Culbert
(74) *Attorney, Agent, or Firm* — Clark & Brody

(57) ABSTRACT

Method and device for selectively etching a first material (4) relative to a second material (2), comprising a bath (11) of a solution capable of producing at least one chemical species for etching the first material (4) but not the second (2) and a system (12) for generating ultrasound at a frequency between 100 kHz and 3 MHz in the bath in order to produce cavitation bubbles.

8 Claims, 1 Drawing Sheet

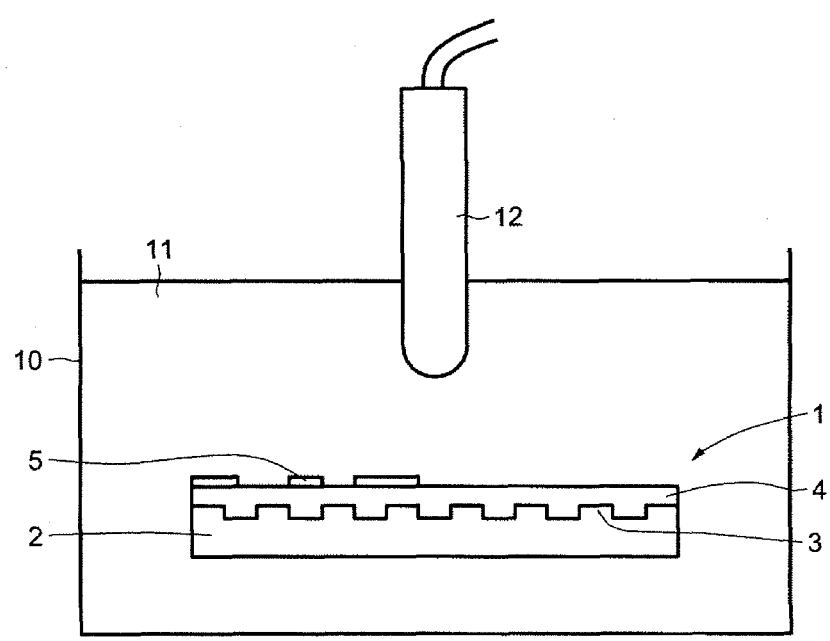

METHOD FOR SELECTIVE ETCHING

The present invention relates to the field of etching a material.

The present invention may relate more particularly to the field of the production of semiconductor components, in which, during production, numerous steps are generally provided for selectively etching one material relative to another or others, to the field of recovering semiconductor substrates having defects, in which it is desired to remove a surface layer in order to recover a subjacent substrate, possibly already provided with a certain number of layers formed in a suitable way, and to the field of improving the surface state of a layer of a material.

Generally, when it is desired to remove a layer deposited on a substrate in a selective manner relative to another layer, after having possibly masked part of the layer to be removed if it is desired to remove only part thereof, two main methods exist in the field of the fabricating semiconductor components.

The first family of methods consists of "wet" etching in which the structure, one layer of which is to be etched, is immersed in an etchant, typically one based on hydrochloric or hydrofluoric acid. Several mixtures have been developed for allowing selective etching of one layer relative to another, for example a silicon oxide layer relative to a silicon nitride layer, a silicon oxide layer relative to silicon, or a metal layer relative to an insulating layer.

Within this family, document U.S. 6,746,967 describes a method for oxidizing nickel in an oxidizing solution at a controlled pH. Simply to accelerate oxidation, the presence of low-frequency ultrasound modifies the energy barrier necessary for the nickel to be etched by the solution.

The second family of methods, called "dry" etching, consists of placing the structure carrying the layer to be removed in a plasma containing etchants, for example active radicals of chlorine, fluorine, oxygen etc.

The second family of methods has many advantages compared with the first, notably from the fact that it permits anisotropic attack and that it often has better etching selectivity between two materials. However, it has the disadvantage of requiring complex equipment and, in the case where the layer to be etched is carried by a silicon substrate, of only making it possible to treat one or two silicon substrates at the same time. On the other hand, although the first family of methods is often impossible to put into practice when it is desired to perform highly selective etching of one material relative to another material, it has the advantage of allowing batch treatments, it being possible for many wafers to be placed in a boat and then immersed in the etching solution.

Various variants of these two families of methods are known to a person skilled in the art. For example, as regards the "wet" etching method, it is sometimes proposed to improve the result by applying an electric field between the material to be etched and the etching solution.

A third family of methods, more generally used for cleaning and degreasing surfaces, consists of immersing the surface in a cleaning bath, for example an alcohol bath, and of applying sound vibrations to the liquid medium at relatively low sound frequencies, usually of the order of 20 to 45 kHz. The vibrations then assist in detaching dirt particles from the surface to be cleaned.

In addition, in "wet" etching methods, mixers are normally used to circulate the etching liquid over the surface of the material to be etched, and possibly low-frequency sound waves, between 1 and 40 kHz, in order to improve mixing. For example, in document U.S. Pat, No. 4,544,066, the solution is agitated by low-frequency ultrasound in order to even out the reaction over the surface.

One subject of the present invention is a method for selectively etching a structure comprising at least one first material to be etched and at least one second material.

According to the invention, this method comprises the following steps:
  choosing at least one chemical species capable of reacting with the first material and of not reacting with the second material;
  choosing at least one soluble compound that does not react with said materials but which is able to release the aforementioned chemical species;
  producing a solution containing said compound;
  immersing the structure in the solution; and
  producing ultrasound in the solution with at least one frequency capable of generating cavitation bubbles such that the chemical species is generated and reacts selectively with the first material, while producing a soluble compound or a precipitate.

According to the invention, the ultrasound frequency may lie between 100 kHz and 3 MHz.

According to the invention, the ultrasound frequency may lie between 200 kHz and 600 kHz.

According to the invention, the solution may be at a concentration of less than five moles per liter.

According to the invention, the period during which ultrasound is produced may be determined in order to remove the first material completely.

According to the invention, the period during which ultrasound is produced may be determined in order to remove the first material from uncovered surfaces of the latter.

According to the invention, the period during which ultrasound is produced may be determined in order to reduce the roughness of the surface of the first material.

According to the invention, the period during which ultrasound is produced may be determined in order to reduce the thickness of the first material.

The other subject of the present invention is a device for selectively etching a first material relative to a second material.

According to the invention, this device comprises a bath of a solution that does not react with said materials but which is capable of producing at least one chemical species for etching the first material without etching the second and a system for generating ultrasound at a frequency between 100 kHz and 3 MHz in the bath.

The present invention will now be described in greater detail through the description of particular embodiments, as nonlimiting examples, in relation to the etching equipment of the appended single figure.

EXAMPLE 1

A structure has been represented in the figure in the form of a wafer 1 comprising a silicon substrate 2 coated with an insulating layer, for example a layer of silicon oxide 3 etched in a certain pattern so as to exhibit inequalities in thickness, for example in a checkered pattern, and covered with a layer of copper 4. Normally, in practice, an intermediate tie layer, for example a layer of titanium nitride TiN, is deposited at the interface between the oxide layer 2 and the copper layer 3.

As an example of the order of magnitude, the silicon wafer 1 may have a thickness of several hundreds of μm, the oxide layer 2 may have a thickness less than 25 μm and for example a thickness less than 0.1 μm in its thinner parts, and the copper layer may have a thickness of the order of 1 μm.

In a variant shown in the right-hand part of the wafer, an attempt is made to remove the copper layer 3 completely so as to recover the subjacent substrate.

According to another variant shown on the left hand part of the wafer, an attempt is made to remove part of the layer 3 locally that is unprotected by a mask 5, in order to perform an intermediate step for producing a semiconductor device.

In order to etch the copper layer 4, the wafer 1 containing a solution or bath 11 contained in a chamber is immersed and an ultrasound emitter 12 or other source of high-frequency sound waves, introduced into the solution 11, is activated.

A solution is chosen containing molecules that do not etch copper or silicon or the mask and are capable of releasing a chemical species capable of reacting with copper without this chemical species reacting with silicon and with the material of which the mask is made.

High-frequency sound waves are chosen that are able to generate cavitation bubbles, namely sound waves having a frequency above 100 kHz, for example between 100 kHz and 3 MHz, preferably between 200 kHz and 3 MHz, and even more preferably of the order of 200 to 600 kHz. Within these frequency ranges, the size of the cavitation bubbles may reach values of the order of 1 μm for frequencies of the order of 400 kHz and fall again to values of the order of 0.1 μm for frequencies of the order of 1 MHz.

According to a particular example, in order to attack the copper layer 4, a solution of HCl may be chosen at 1 mole per liter and an ultrasound emitter 12 may be chosen providing sound waves at a frequency of the order of 400 kHz and at a power of the order of 300 watts.

Under these conditions, cavitation bubbles that last a very short time, in which the pressures may reach values of the order of several atmospheres and the temperatures may be close to several thousands of degrees, are generated, notably and more particularly at the surface of the wafer 1, and bring about the formation of the chemical species $Cl°$ from molecules of HCl. The chemical species $Cl°$ produced reacts with copper, producing $CuCl$ or $CuCl_2$.

It should be noted that the etching obtained is quite specific to the phenomenon of creating the chemical species $Cl°$. In point of fact, copper in contact with an HCl solution with the same concentration does not react, even in the presence of agitation created by an ultrasound emitter at a low frequency, for example 40 kHz.

For the thicknesses indicated above, after an exposure of a few minutes, complete removal of the metallic copper layer 4 is obtained, totally or locally, without the silicon oxide layer 3 being etched, that is to say without etching that could be greater than approximately one nanometer.

EXAMPLE 2

Using a silicon wafer carrying a silicon oxide layer, an attempt is made to remove this silicon oxide layer.

This wafer is placed in a solution of NaOH (sodium hydroxide) at 1 mole per liter and sound waves at a frequency of the order of 400 kHz and a power of the order of 300 watts are emitted into this solution.

Under these conditions, as in the previous example, cavitation bubbles generated in the solution, notably and more particularly at the surface of the wafer, bring about the formation of the chemical species $OH°$ from NaOH molecules. The chemical species $OH°$ produced reacts with silicon oxide producing $Na_2SiO_4$.

After a few minutes, the layer of silicon oxide is removed without any etching of the subjacent silicon.

It may also be noted that in the absence of sound waves at the frequency indicated, silicon oxide is not etched by sodium hydroxide.

EXAMPLE 3

Using a silicon wafer carrying a copper layer as in example I or a layer of silicon oxide as in example II, an attempt is made to reduce the roughness of the surface of this layer.

To this end, the conditions of example I or of example II may for example be employed respectively, but the action of the ultrasound emitter is limited in duration, for example to a few seconds, so that only the material constituting the rough regions or asperities is at least partially etched.

Attack of the rough regions is more effective as the density of the cavitation bubbles increases at the ends of these rough regions or asperities.

EXAMPLE 4

Using a wafer having a copper layer as in example I or a silicon oxide layer as in example II, an attempt is made to reduce the thickness of this layer.

To this end, it is possible to employ for example the conditions of example I or of example II, but the duration of the action of the ultrasound emitter is limited and controlled so that the remaining thickness of the layer reaches a desired value.

Considering the previous examples, the present invention is generally applied to the selective etching of a first material relative to a second material of a structure, while making the following provisions.

A chemical species is chosen that is capable of reacting with the first material to be etched and of not reacting with the second material.

A soluble compound is chosen that does not etch the materials and is capable of releasing the selected chemical species.

Having prepared a solution containing this compound and having immersed the structure in the solution, ultrasound is produced in the solution, at a frequency capable of generating cavitation bubbles.

The result is that cavitation bubbles, in which pressures reach values of the order of several atmospheres and the temperature approaches several thousands of degrees, bring about the production, in the solution and notably in the vicinity of the solid surface to be treated, of the chosen chemical species that reacts selectively with the first material producing a soluble compound or precipitate, without etching the second material. It may be considered that a certain equivalence exists between what has just been described and certain plasmas.

In order to select the suitable chemical species and the suitable soluble compound, a person skilled in the art will know how to use for example the "FactSage" software containing the European SGTE database so as to determine a chemical species likely to react with a first material to produce a soluble compound or one that can easily crumble away, or a precipitate, this chemical species not reacting with a second material.

The SGTE database is not the only thermodynamic database available to a person skilled in the art. Other existing bases exist such as for example the "Thermo-Calc" software. In order to access the "Thermo-Calc" or "FactSage" software, it is sufficient to connect to the following websites: http://www.thermocalc.com; www.factsage.com; www.gtt-technologies.com.

These bases serve to support software programs which, by minimizing the Gibbs energy, are capable of giving thermodynamically stable compounds that will be formed by chemical reaction from a given starting mixture. "Thermodynamically stable" is understood to mean a product that would be obtained after an infinite reaction time. The following may for example be observed.

a starting mixture of silica+solid copper+HCl diluted to 1 mole per liter does not change (remains stable). If it is added into the calculation that Cl° radicals exist in solution, solid copper will be transformed completely into $Cu(OH)_2$ and $Cu^{2+}$ but silica will not change;

a starting mixture of silicon+silica and sodium hydroxide at 1 mole per liter is a thermodynamically stable mixture (no change). If it is added to the calculation that the chemical species OH° or Na° are to be formed in solution, the thermodynamic software shows that silica will be converted into the solid compound $H_4SiO_4$ while silicon will remain stable.

A person skilled in the art will know how to determine what chemical species may form in a given solution and how to test, by using the abovementioned software, what phases (compounds or pure bodies) will be stable in solution and which will change by chemical reaction.

The following examples may be noted for choosing a chemical species intended to etch a first material without etching a second material of a wafer.

The chemical species OH° may be active for etching Si, without etching SiGe.

The chemical species H° may be active for etching $InSnO_3$, without etching $SiO_2$.

The chemical species Cl° may be active for etching Cu, without etching $SiO_2$.

The chemical species F° may be active for etching Si, without etching a polymer.

The chemical species Cl° may be active for etching Au, without etching an AlN ceramic.

The chemical species OH° or the chemical species Cl° may be active for etching Al, without etching $Al_2O_3$.

The chemical species OH° may be active for etching W, without etching $Al_2O_3$.

The chemical species Cl° may be active for etching Cu, without etching $SiO_2$ or a TiN ceramic.

The chemical species H° or the chemical species Cl° may be active for etching $InSnO_2$, without etching a polymer or a glass.

The chemical species Na° or the chemical species F° may be active for etching $SiO_2$, without etching Al.

The chemical species H° or the chemical species F° may be active for etching $Al_2O_3$, without etching W.

The chemical species Br° may be active for etching TiN, without etching $SiO_2$.

The chemical species K° may be active for etching $Si_3N_4$, without etching SiO or a polymer.

The chemical species Cl° may be active for etching a TaN ceramic, without etching $SiO_2$.

In addition, a person skilled in the art will know, by simple tests, how to determine in each particular case the concentration of the chosen solution, the optimum frequency and optimum power of the ultrasound so that the effect of the cavitation bubbles produced will bring about the desired etching, as well as the duration of treatment to be applied to the first material to be etched.

Among the advantages of the present invention, the great simplicity of the implementing device will be noted as well as the fact that a batch of wafers may be treated simultaneously in the same bath.

In another example, the present invention may be used for cleaning electrical contact points, in particular for chemically etching aluminum particles deposited on tungsten probes used for testing electronic chips.

Another advantage of the present invention lies in the fact that the solutions used are at low concentrations and are therefore not very harmful and do not present, or present only few, environmental problems.

In addition, as a complement to ultrasound, an electric field could for example be applied between the material to be etched and the etching solution in order to modify the treatment.

The invention claimed is:

1. A method for selectively etching a structure (1) comprising at least one first material to be etched (4) and at least one second material (2), comprising the following steps:
choosing at least one chemical species capable of reacting with the first material (4) and of not reacting with the second material (3);
choosing at least one soluble compound that does not react with said materials but which is able to release the aforementioned chemical species;
producing a solution (11) containing said compound;
immersing the structure (1) in the solution; and
producing controlled ultrasound in the solution with at least a frequency between 100 kHz and 3 MHz and at a power capable of generating cavitation bubbles such that the chemical species is generated and reacts selectively with the first material, while producing a soluble compound or a precipitate.

2. The method as claimed in claim 1, in which the ultrasound frequency lies between 100 kHz and 3 MHz.

3. The method as claimed in claim 1, in which the ultrasound frequency lies between 200 kHz and 600 kHz.

4. The method as claimed in claim 1, in which the solution is at a concentration of less than five moles per liter.

5. The method as claimed in claim 1, in which the period during which ultrasound is produced is determined in order to remove the first material completely.

6. The method as claimed in claim 1, in which the period during which ultrasound is produced is determined in order to remove the first material from uncovered surfaces of the latter.

7. The method as claimed in claim 1, in which the period during which ultrasound is produced is determined in order to reduce the roughness of the surface of the first material.

8. The method as claimed in claim 1, in which the period during which ultrasound is produced is determined in order to reduce the thickness of the first material.

* * * * *